US011493562B2

United States Patent
Zouboff et al.

(10) Patent No.: US 11,493,562 B2
(45) Date of Patent: Nov. 8, 2022

(54) METHOD FOR ESTIMATING THE AGEING OF A VEHICLE BATTERY

(71) Applicant: Vitesco Technologies GmbH, Regensburg (DE)

(72) Inventors: Pierre Zouboff, Toulouse (FR); Valérie Gouzenne Coutier, Toulouse (FR)

(73) Assignee: Vitesco Technologies GmbH

(*) Notice: Subject to any disclaimer, the term of this patent is extended or adjusted under 35 U.S.C. 154(b) by 0 days.

(21) Appl. No.: 17/634,028

(22) PCT Filed: Sep. 25, 2020

(86) PCT No.: PCT/EP2020/077007
§ 371 (c)(1),
(2) Date: Feb. 9, 2022

(87) PCT Pub. No.: WO2021/058803
PCT Pub. Date: Apr. 1, 2021

(65) Prior Publication Data
US 2022/0291292 A1     Sep. 15, 2022

(30) Foreign Application Priority Data

Sep. 27, 2019  (FR) .................................. FR1910694

(51) Int. Cl.
*G01M 15/00*       (2006.01)
*G01R 31/392*     (2019.01)
(Continued)

(52) U.S. Cl.
CPC ......... *G01R 31/392* (2019.01); *G01K 13/026* (2021.01); *G01M 15/042* (2013.01)

(58) Field of Classification Search
CPC .. G01R 31/392; G01K 13/026; G01M 15/042
See application file for complete search history.

(56) References Cited

U.S. PATENT DOCUMENTS 7,743,649 B1 * 6/2010 Salman ............... F02N 11/0859
                                                              73/114.59
7,948,099 B2    5/2011 Mottier
(Continued)

FOREIGN PATENT DOCUMENTS

EP      1686391 A1    8/2006
KR   20070117091 A   12/2007
(Continued)

OTHER PUBLICATIONS

International Search Report and Written Opinion for International Application No. PCT/EP2020/077007, dated Nov. 27, 2020, with partial English translation, 7 pages.
(Continued)

*Primary Examiner* — Freddie Kirkland, III
(74) *Attorney, Agent, or Firm* — RatnerPrestia

(57) ABSTRACT

A method for estimating the aging of a battery of a motor vehicle with a combustion engine, the vehicle including an electric starter, a temperature sensor for the temperature of the coolant, a speed sensor for the speed of the combustion engine and a computer for managing the drive system of the vehicle. The method includes, each time the combustion engine is started, the steps of the computer determining the value of the speed of the combustion engine and the value of the temperature, if the determined value of the speed is higher than a speed threshold, incrementing a first counter, if the determined value of the speed is lower than the speed threshold, incrementing a second counter, detecting the aging of the battery when the value of the second counter is higher than a predetermined alert threshold.

14 Claims, 2 Drawing Sheets

(51) Int. Cl.
G01M 15/04 (2006.01)
G01K 13/02 (2021.01)

(56) References Cited

U.S. PATENT DOCUMENTS

| | | | |
|---|---|---|---|
| 8,972,213 B2 | 3/2015 | Zhang et al. | |
| 10,672,199 B2* | 6/2020 | Landolsi | F02M 35/10386 |
| 11,203,273 B2* | 12/2021 | Otjens | B60L 58/12 |
| 2010/0154524 A1 | 6/2010 | Salman et al. | |

FOREIGN PATENT DOCUMENTS

| | | |
|---|---|---|
| WO | 2006125872 A1 | 11/2006 |
| WO | 2009158225 A2 | 12/2009 |

OTHER PUBLICATIONS

International Search Report and Written Opinion for international Application No. PCT/EP2020/077007, dated Nov. 27, 2020, 12 pages (French).

English Translation of the Written Opinion for International Application No. PCT/EP2020/077007, dated Nov. 27, 2020, 5 pages.

* cited by examiner

METHOD FOR ESTIMATING THE AGEING OF A VEHICLE BATTERY

CROSS REFERENCE TO RELATED APPLICATIONS

This application is the U.S. National Phase Application of PCT International Application No. PCT/EP2020/077007, filed Sep. 25, 2020, which claims priority to French Patent Application No. 1910694, filed Sep. 27, 2019, the contents of such applications being incorporated by reference herein.

FIELD OF THE INVENTION

The invention relates to the field of batteries, in particular lead-acid batteries, for the automotive industry, and in particular to a method for estimating the aging of a battery, in particular lead-acid batteries, and to a computer configured to implement this method. The invention makes it possible in particular to indicate to the driver when the vehicle's battery needs to be changed in order to continue to be sure that the vehicle's engine will start.

BACKGROUND OF THE INVENTION

In known manner, a motor vehicle comprises a battery, allowing in particular electrical power to be supplied to the vehicle's auxiliary equipment such as, for example, control computers, windshield wiper motors, window lift motors, door controls, etc.

The battery also allows an electric starter to be driven in order to start the vehicle's engine.

When a vehicle battery is worn out, it is no longer possible to charge it sufficiently to be able to start the vehicle's engine. It is estimated, for example, that a battery is worn out when its charging capacity is less than 60% of its initial charging capacity, that is to say when it was new. It is then necessary to replace it with a new battery.

Nowadays, in order to detect the state of wear of a vehicle's battery, it is known practice to use a battery management system, or BMS, known to those skilled in the art. Such a system comprises, in particular, a set of sensors integrated into the battery and a computer connected to the set of sensors. The set of sensors makes it possible, in particular, to determine information relating to the battery, such as the voltage, temperature, state of charge or discharge, current, etc. The computer uses this information to check that the battery is operating within its standard operating range or, conversely, to detect when the battery has become worn out.

However, this type of system, in particular the battery comprising a set of sensors, is complex and expensive, which presents a major drawback in the automotive field where costs must be strictly controlled.

There is therefore a need for an efficient and inexpensive solution for estimating the aging of a lead-acid battery in a motor vehicle.

SUMMARY OF THE INVENTION

An aspect of the invention relates to a method for estimating the aging of a battery of a motor vehicle with a combustion engine, either pure or hybrid, said vehicle comprising an electric starter, a temperature sensor able to measure the value of a physical quantity relating to the temperature of the coolant, a speed sensor able to measure the value of a physical quantity relating to the engine speed of the combustion engine, and a computer for managing the drive system of the vehicle, suitable for collecting the values measured by the temperature sensor and the speed sensor and for implementing a first counter and a second counter, said method being noteworthy in that it comprises, each time the combustion engine is started by means of said electric starter, and when the combustion engine is driven by the electric starter, the steps of:

a) the computer receiving the value measured by the speed sensor and the value measured by the temperature sensor, b) the computer determining the value of the engine speed of the combustion engine on the basis of the value measured by the speed sensor and the value of the temperature on the basis of the value measured by the temperature sensor, c) comparing the determined value of the engine speed with a speed threshold predetermined as a function of the determined temperature of the coolant and where:
  i) if the determined value of the engine speed is higher than the speed threshold, predetermined at the determined temperature, incrementing the first counter,
  ii) if the determined value of the engine speed is lower than the speed threshold, predetermined at the determined temperature, incrementing the second counter, d) detecting the aging of the battery when the value of the second counter is higher than an alert threshold predetermined as a function of the value of the first counter.

Thus, the method advantageously makes it possible to determine when the battery has become worn out and that it would be advisable to change it. In addition, the method makes it possible to use a battery without any sensors, since the necessary information is supplied by the temperature sensor and the speed sensor, which are sensors independent of the battery.

Preferably, the battery is a lead-acid battery.

The speed of the combustion engine corresponds to the speed of rotation of the crankshaft of said combustion engine.

Advantageously, the predetermined alert threshold is equal to the current value of the first counter.

Preferably, the method according to an aspect of the invention comprises a preliminary learning phase carried out when the battery is new, comprising:

a) an iterative step, performed over a range of temperatures of the coolant when the combustion engine is driven by means of the electric starter, comprising the steps of:
  i) the speed sensor measuring the value of a physical quantity relating to the engine speed of the combustion engine on starter at a given temperature in the range of temperatures,
  ii) the computer receiving the value measured by the speed sensor,
  iii) the computer determining the value of the engine speed of the combustion engine on starter at a given temperature in the range of temperatures, on the basis of the value measured by the speed sensor, b) a step of determining a curve of speed thresholds as a function of the temperature of the coolant on the basis of the determined speed values.

Preferably, the step of determining the curve of speed thresholds as a function of the temperature of the coolant is performed on the basis of the determined engine speed values and of a predetermined limit tolerance value.

Preferably, the iterative step of the learning phase is performed N times, N being a natural number between fifty and one hundred, preferably eighty.

Advantageously, the limit tolerance value is between twenty and fifty revolutions per minute.

Preferably, after the step of detecting the aging of the battery, the method comprises a phase of warning the driver and/or the vehicle of the advanced state of wear of said battery.

Specifically, for example, a sound signal or an indicator light indicates the state of wear of the battery to the driver. Thus, the driver may take the necessary measures to change their battery in order to avoid a potential breakdown. Specifically, when a battery is worn out, its charging capacity is no longer sufficient and said battery is no longer able to supply enough electrical power to the vehicle's electric starter.

An aspect of the invention also relates to a computer for managing the drive system of a motor vehicle with a combustion engine, either pure or hybrid, said vehicle comprising an electric starter, a temperature sensor able to measure the value of a physical quantity relating to the temperature of the coolant, a speed sensor able to measure the value of a physical quantity relating to the engine speed of the combustion engine, the computer being suitable for collecting the values measured by the temperature sensor and the speed sensor and for implementing a first counter and a second counter, said computer being configured for, each time the combustion engine is started by means of said electric starter, and when the combustion engine is driven by the electric starter:
  a) receiving the value measured by the speed sensor and the value measured by the temperature sensor,
  b) determining the value of the engine speed of the combustion engine on the basis of the value measured by the speed sensor and the value of the temperature on the basis of the value measured by the temperature sensor,
  c) comparing the determined value of the engine speed with a speed threshold predetermined as a function of the measured temperature of the coolant and where:
    i) if the determined value of the engine speed is higher than the speed threshold, predetermined at the measured temperature, the computer is configured to increment the first counter,
    ii) if the determined value of the engine speed is lower than the speed threshold, predetermined at the measured temperature, the computer is configured to increment the second counter,
  d) detecting the aging of the battery when the value of the second counter is higher than an alert threshold predetermined as a function of the value of the first counter.

Preferably, the predetermined alert threshold used by the computer to detect the aging of the battery is equal to the current value of the first counter.

Preferably, when the battery is new, the computer is configured for a preliminary learning phase, comprising:
  a) an iterative step, performed over a range of temperatures of the coolant when the combustion engine is driven by means of the electric starter, comprising the steps of:
    i) the speed sensor measuring the value of a physical quantity relating to the engine speed of the combustion engine on starter at a given temperature in the range of temperatures,
    ii) the computer receiving the value measured by the speed sensor,
    iii) the computer determining the value of the engine speed of the combustion engine on starter at a given temperature in the range of temperatures, on the basis of the value measured by the speed sensor,
  b) a step of determining a curve of speed thresholds as a function of the temperature of the coolant on the basis of the determined speed values.

Preferably, the computer determines the curve of speed thresholds as a function of the temperature of the coolant on the basis of the determined speed values and of a predetermined limit tolerance value.

Preferably, the computer is configured to receive the value measured by the speed sensor and to determine the value of the engine speed of the combustion engine on the basis of the value measured by the speed sensor N times, N being a natural number between fifty and one hundred, preferably eighty.

Advantageously, the limit tolerance value is between twenty and fifty revolutions per minute.

Preferably, after the step of detecting the aging of the battery, the computer is configured to warn the driver and/or the vehicle of the advanced state of wear of said battery.

Lastly, an aspect of the invention relates to a vehicle with a combustion engine, either pure or hybrid, comprising an electric starter, a temperature sensor able to measure the value of a physical quantity relating to the temperature of the coolant, a speed sensor able to measure the value of a physical quantity relating to the engine speed of the combustion engine, and a computer for managing the drive system of the vehicle as presented above, suitable for collecting the values measured by the temperature sensor and the speed sensor and for implementing a first counter and a second counter.

BRIEF DESCRIPTION OF THE DRAWINGS

Further features and advantages of aspects of the invention will become more clearly apparent from reading the following description. This description is purely illustrative and should be read with reference to the accompanying drawings, in which.

DETAILED DESCRIPTION OF THE PREFERRED EMBODIMENTS

Vehicle

Figure 1:
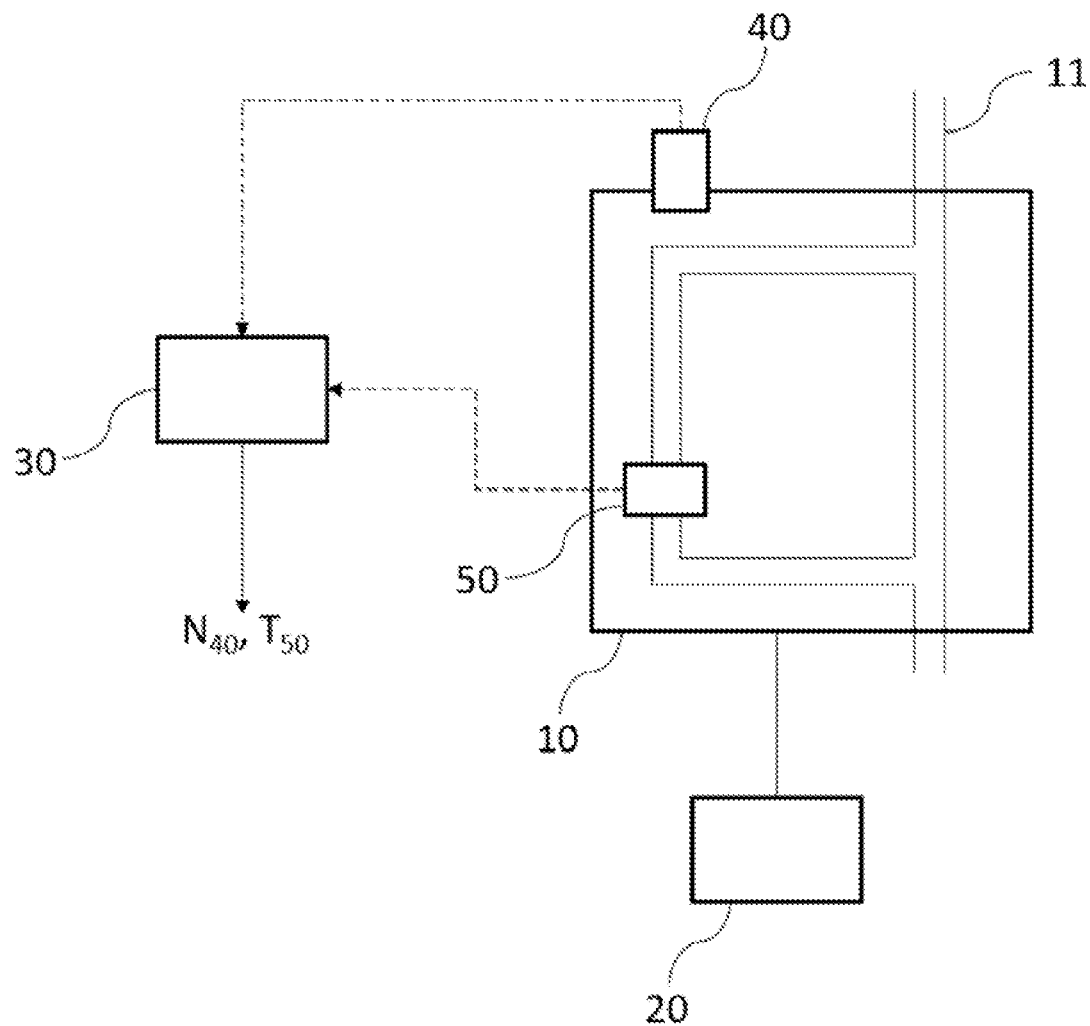
FIG. 1 illustrates one embodiment of the vehicle according to the invention.

With reference to FIG. 1, one embodiment of the vehicle according to the invention will be presented. Said vehicle, in particular a motor vehicle, comprises a combustion engine 10, either pure or hybrid, a battery 20, in particular a lead-acid battery, and a computer 30 for managing the vehicle's drive system.

The vehicle also comprises a speed sensor 40 and a temperature sensor 50.

Combustion Engine 10

The combustion engine 10 makes it possible to convert heat energy, originating from the combustion of the fuel supplied to said combustion engine 10, into mechanical energy allowing the wheels of the vehicle to be turned, in order to set said vehicle in motion.

The combustion engine 10 also comprises a cooling system 11 through which flows a coolant for preventing the combustion engine 10 from overheating, and an electric starter (not shown), allowing the combustion engine 10 to be started when it is actuated.

Battery 20

The vehicle's battery 20 is an electrical energy storage system used as a power source for the vehicle's auxiliary electrical equipment, such as, for example, computers, windscreen wiper motors, window lift motors, etc. In particular, the battery 20 is connected to the electric starter of the combustion engine 10 and supplies said starter with electrical power, in order to start the combustion engine 10.

Speed Sensors 40

The speed sensor 40 is able to measure the value of a physical quantity relating to the speed, called the "engine" speed $N_{40}$, of the combustion engine 10, in particular when the vehicle is started, that is to say when the combustion engine is driven by the electric starter.

The speed sensor 40 can also be configured to directly measure the value of the engine speed $N_{40}$.

The speed sensor 40 is also configured to send the measured value to the computer 30.

Temperature Sensors 50

The temperature sensor 50 is, for its part, able to measure the value of a physical quantity relating to the temperature $T_{50}$ of the coolant, in particular when the vehicle is started, when the combustion engine is driven by the electric starter.

The temperature sensor 50 can also be configured to directly measure the value of the temperature $T_{50}$.

The temperature sensor 50 is also configured to send the measured value to the computer 30.

Computer 30

The computer 30 comprises a processor able to implement a set of instructions allowing the actions described hereinbelow to be performed.

First of all, the computer 30 is configured to implement a first counter, designated $C_{pt1}$, and a second counter, designated $C_{pt2}$.

The computer 30 is, in particular, configured to receive the value measured by the speed sensor 40 and the value measured by the temperature sensor 50 each time the combustion engine is driven by means of the electric starter.

The computer 30 is also configured to determine the value of the engine speed $N_{40}$ of the combustion engine 10 on the basis of the value measured by the speed sensor 40 and the value of the temperature $T_{50}$ on the basis of the value measured by the temperature sensor 50.

The determined engine speed $N_{40}$ corresponds, in particular, to the speed of rotation of the crankshaft of the combustion engine 10, in particular defined as the number of revolutions made by the crankshaft in one minute.

The computer 30 is also configured to compare the determined value of the engine speed $N_{40}$ with a speed threshold $S_R(T_{50})$ predetermined at the determined temperature $T_{50}$. The speed threshold $S_R(T_{50})$ is determined on the basis of a curve of speed thresholds $S_R(T)$ predetermined as a function of the temperature of the coolant. Specifically, the speed threshold $S_R(T_{50})$ corresponds to the value of the curve of speed thresholds $S_R(T)$, for the determined temperature $T_{50}$ of the coolant.

If the determined value of the engine speed $N_{40}$ is higher than the predetermined speed threshold $S_R(T_{50})$, the computer 30 is configured to increment the value of the first counter $C_{pt1}$. Conversely, if the determined value of the engine speed $N_{40}$ is lower than the predetermined speed threshold $S_R(T_{50})$, the computer 30 is configured to increment the value of the second counter $C_{pt2}$.

Lastly, the computer 30 is configured to detect the aging of the battery 20 when the value of the second counter $C_{pt2}$ is higher than a predetermined alert threshold, the predetermined alert threshold being equal to the current value of the first counter $C_{pt1}$.

When the computer 30 has detected the aging of the battery 20, the computer 30 is configured to warn the driver and/or the vehicle of the advanced state of wear of said battery 20.

In addition, when the battery 20 is new, the computer 30 is configured to determine the curve of speed thresholds $S_R(T)$ as a function of the temperature of the coolant of the combustion engine 10.

For this, the computer 30 is first configured to receive, each time the combustion engine is driven by means of the electric starter, after having fitted the new battery 20 in said vehicle, the value measured by the speed sensor 40.

In addition, the computer 30 is configured to determine the value of the engine speed $N_{40}$ of the combustion engine 10, on the basis of the measured value, at a given temperature in a range of temperatures. For example, the range of temperatures is defined between −40 and 150° C., corresponding to the temperature range for an engine commonly considered by automotive manufacturers.

The computer 30 is configured to determine the value of the engine speed $N_{40}$ when the combustion engine is driven by means of the electric starter a finite number N of times, for example between fifty and one hundred, preferably eighty times.

Said computer 30 is then configured to determine a curve of speed thresholds $S_R(T)$ as a function of the temperature of the coolant on the basis of the determined values of the engine speed $N_{40}$.

For this, first of all, the computer 30 is configured to determine a continuous curve N(T) representing the variation in the value of the engine speed $N_{40}$ on starter as a function of the temperature of the coolant, on the basis of the previously determined discrete values of the engine speed $N_{40}$. Said continuous curve N(T) represents the value of the reference engine speed on starter with the new battery for said vehicle.

The equation for the continuous curve N(T) can, in particular, be determined by applying the method of least squares to the previously determined discrete values of the engine speed $N_{40}$.

The computer 30 is configured to determine the curve of speed thresholds $S_R(T)$ on the basis of the previously determined continuous curve N(T) and of a limit tolerance value $x_s$.

The limit tolerance value $x_s$ is a value predetermined by the manufacturer. This value can, in particular, be predetermined by modeling or via a series of measurements. Said limit tolerance value $x_s$ subtracted from the continuous curve N(T) represents the limit below which signs of aging appear on said battery. The limit tolerance value $x_s$, which can vary between 20 and 40 revolutions per minute, is therefore already determined when the vehicle leaves the factory.

Thus, the curve of speed thresholds $S_R(T)$ is defined as follows: $S_R(T)=N(T)-x_s$.

Method

Figure 2:
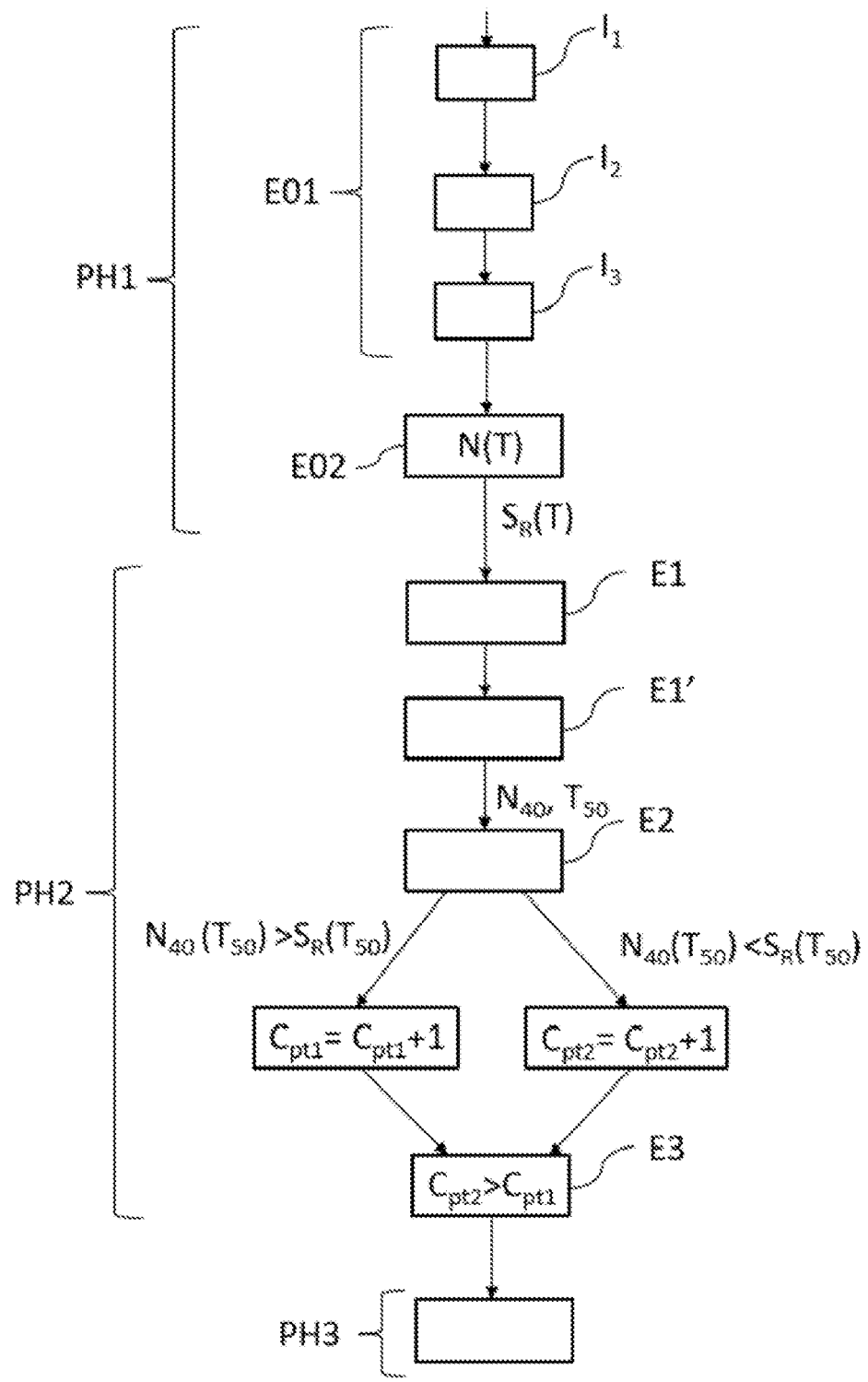
FIG. 2 illustrates one embodiment of the method according to the invention.

With reference to FIG. 2, one embodiment of the method, implemented by the computer 30 of a vehicle as presented above, will now be presented.

The method advantageously comprises a preliminary learning phase PH1, a phase of use PH2 and a warning phase PH3.

Preliminary Learning Phase PH1

The preliminary learning phase PH1 is carried out when a new battery 20 has been fitted in a vehicle, and comprises an iterative step E01 and a step E02 of determining the curve of speed thresholds $S_R(T)$ as a function of the temperature of the coolant.

Iterative step E01 comprises a step $I_1$ of starting the combustion engine 10 of the vehicle, followed by a step $I_2$ of the speed sensor 40 measuring the value of a physical quantity relating to the engine speed, at a given temperature in a range of temperatures, between −40 and 150° C., corresponding to the range of temperatures of a combustion engine commonly considered by automotive manufacturers.

Iterative step E01 then comprises a step of the computer 30 receiving the value measured by the speed sensor 40 on starter. Lastly, iterative step E01 comprises a step 13 of the computer 30 determining the value of the engine speed $N_{40}$ of the combustion engine 10 when the vehicle is started at a given temperature in the range of temperatures, on the basis of the received measured value.

Iterative step E01 of learning phase PH1 is performed N times, N being a natural number between fifty and one hundred, preferably eighty.

The step E02 of determining a curve of speed thresholds $S_R(T)$ is performed when all of the iterations of iterative step E01 have been carried out.

In determining step E02, a continuous curve N(T) representing the variation in the engine speed $N_{40}$ as a function of the temperature of the coolant is determined on the basis of the determined discrete values of the engine speed $N_{40}$.

Next, the curve of speed thresholds $S_R(T)$ is determined on the basis of the previously determined continuous curve N(T), and of the limit tolerance value $x_s$.

Thus, the curve of speed thresholds $S_R(T)$ is defined as follows: $S_R(T)=N(T)-x_s$.

Once the curve of speed thresholds $S_R(T)$ has been determined, the phase of use PH2 is carried out.

Phase of Use PH2

The phase of use PH2 first of all comprises, each time the combustion engine is started by means of the electric starter, and when the combustion engine is driven by the electric starter, a step E1 of the speed sensor 40 measuring the value of a physical quantity relating to the engine speed $N_{40}$ of the combustion engine 10, and of the temperature sensor 50 measuring the value of a physical quantity relating to the temperature $T_{50}$ of the coolant.

Measuring step E1 can also consist of the direct measurement of the engine speed $N_{40}$ of the combustion engine 10 by the speed sensor 40 and of the temperature $T_{50}$ of the coolant by the temperature sensor 50.

The value measured by the speed sensor 40 or by the temperature sensor 50, respectively, is sent to the computer 30.

The phase of use PH2 then comprises a step E1' of determining the value of the engine speed $N_{40}$ of the combustion engine 10 on the basis of the value measured by the speed sensor 40 and the value of the temperature $T_{50}$ on the basis of the value measured by the temperature sensor 50.

For each determined value of the engine speed $N_{40}$, the phase of use PH2 then comprises a step E2 of comparing the determined value of the engine speed $N_{40}$ with the predetermined speed threshold $S_R(T_{50})$, at the previously determined temperature $T_{50}$.

If the determined value of the engine speed $N_{40}$ is higher than the speed threshold $S_R(T_{50})$ at the determined temperature $T_{50}$, the first counter $C_{pt1}$ is incremented.

Conversely, if the determined value of the engine speed $N_{40}$ is lower than the speed threshold $S_R(T_{50})$ at the determined temperature $T_{50}$, the second counter $C_{pt2}$ is incremented.

After each comparing step E2, the phase of use PH2 comprises a step E3 of detecting the aging of the battery 20 when the value of the second counter $C_{pt2}$ is higher than a predetermined alert threshold, the alert threshold being equal to the current value of the first counter $C_{pt1}$.

In other words, the aging of the battery 20 is detected when the number of times that the determined value of the engine speed $N_{40}$ is lower than the speed threshold $S_R(T)$ is higher than the number of times that the determined value of the engine speed $N_{40}$ is higher than the speed threshold $S_R(T)$.

Warning Phase (PH3)

After the phase of use PH2 and when the aging of the battery 20 has been detected, the method comprises a warning phase PH3 to notify the vehicle's driver that the battery 20 has become worn out and that it should be changed. Specifically, when a battery 20 is worn out, its charging capacity is no longer sufficient and said battery 20 is no longer able to supply enough electrical power to the vehicle's starter.

For example, a sound signal will sound or a warning light will light up on the vehicle's instrument panel to warn the driver of the advanced state of wear of the battery 20.

If the battery 20 is changed following detection of the aging of the battery 20 previously fitted in the vehicle, the values of the first counter $C_{pt1}$ and of the second counter $C_{pt2}$ are reset.

The invention claimed is:

1. A method for estimating an aging of a battery of a motor vehicle with a combustion engineer, said vehicle comprising an electric starter, a temperature sensor able to measure a value of a physical quantity relating to a temperature of the coolant, a speed sensor able to measure a value of a physical quantity relating to engine speed of the combustion engine, and a computer for managing a drive system of the vehicle, suitable for collecting the values measured by the temperature sensor and the speed sensor and for implementing a first counter and a second counter, said method comprising, each time the combustion engine is started by said electric starter, and when the combustion engine is driven by the electric starter, the steps of:
   a) the computer receiving the value measured by the speed sensor and the value measured by the temperature sensor,
   b) the computer determining the value of the engine speed of the combustion engine on the basis of the value measured by the speed sensor and the value of the temperature on the basis of the value measured by the temperature sensor,
   c) comparing the determined value of the engine speed with a speed threshold predetermined as a function of the determined temperature of the coolant and where:
      i) if the determined value of the engine speed is higher than the speed threshold, predetermined at the determined temperature, incrementing the first counter,
      ii) if the determined value of the engine speed is lower than the speed threshold, predetermined at the determined temperature, incrementing the second counter,
   d) detecting the aging of the battery when the value of the second counter is higher than an alert threshold predetermined as a function of the value of the first counter.

2. The method as claimed in claim 1, wherein the predetermined alert threshold is equal to the current value of the first counter.

3. The method as claimed in claim 2, comprising a preliminary learning phase carried out when the battery is new, comprising:
   a) an iterative step, performed over a range of temperatures of the coolant when the combustion engine is driven by the electric starter, comprising the steps of:
      i) the speed sensor measuring the value of a physical quantity relating to the engine speed of the combustion engine on starter at a given temperature in the range of temperatures,
      ii) the computer receiving the value measured by the speed sensor,
      iii) the computer determining the value of the engine speed of the combustion engine on starter at a given temperature in the range of temperatures, on the basis of the value measured by the speed sensor,
   b) a step of determining a curve of speed thresholds as a function of the temperature of the coolant on the basis of the determined speed values.

4. The method as claimed in claim 1, comprising a preliminary learning phase carried out when the battery is new, comprising:
   a) an iterative step, performed over a range of temperatures of the coolant when the combustion engine is driven by the electric starter, comprising the steps of:
      i) the speed sensor measuring the value of a physical quantity relating to the engine speed of the combustion engine on starter at a given temperature in the range of temperatures,
      ii) the computer receiving the value measured by the speed sensor,
      iii) the computer determining the value of the engine speed of the combustion engine on starter at a given temperature in the range of temperatures, on the basis of the value measured by the speed sensor,
   b) a step of determining a curve of speed thresholds as a function of the temperature of the coolant on the basis of the determined speed values.

5. The method as claimed in claim 4, wherein the step of determining of the curve of speed thresholds as a function of the temperature of the coolant is performed on the basis of the determined engine speed values and of a predetermined limit tolerance value.

6. The method as claimed in claim 5, wherein the limit tolerance value is between twenty and fifty revolutions per minute.

7. The method as claimed in claim 5, wherein the iterative step of the learning phase is performed N times, N being a natural number between fifty and one hundred.

8. The method as claimed in claim 4, wherein the iterative step of the learning phase is performed N times, N being a natural number between fifty and one hundred.

9. The method as claimed in claim 8, wherein the limit tolerance value is between twenty and fifty revolutions per minute.

10. The method as claimed in claim 1, comprising, after the step of detecting the aging of the battery, a phase of warning the driver or the vehicle of the advanced state of wear of said battery.

11. A computer for managing a drive system of a motor vehicle with a combustion engine, said vehicle comprising an electric starter, a temperature sensor able to measure a value of a physical quantity relating to a temperature of the coolant, a speed sensor able to measure a value of a physical quantity relating to engine speed of the combustion engine, the computer being suitable for collecting the values measured by the temperature sensor and the speed sensor and for implementing a first counter and a second counter, said computer being configured for, each time the combustion engine is started by said electric starter, and when the combustion engine is driven by the electric starter:
   a) receiving the value measured by the speed sensor and the value measured by the temperature sensor,
   b) determining the value of the engine speed of the combustion engine on the basis of the value measured by the speed sensor and the value of the temperature on the basis of the value measured by the temperature sensor,
   c) comparing the determined value of the engine speed with a speed threshold predetermined as a function of the measured temperature of the coolant and where:
      i) if the determined value of the engine speed is higher than the speed threshold, predetermined at the measured temperature, the computer is configured to increment the first counter,
      ii) if the determined value of the engine speed is lower than the speed threshold, predetermined at the measured temperature, the computer is configured to increment the second counter,
   d) detecting the aging of the battery when the value of the second counter is higher than an alert threshold predetermined as a function of the value of the first counter.

12. The computer as claimed in claim 11, wherein the predetermined alert threshold is equal to the current value of the first counter.

13. A vehicle with a combustion engine, either pure or hybrid, said vehicle comprising an electric starter, a temperature sensor able to measure a value of a physical quantity relating to a temperature of the coolant, a speed sensor able to measure a value of a physical quantity relating to engine speed of the combustion engine, and a computer for managing the drive system of the vehicle as claimed in claim 12, suitable for collecting the values measured by the temperature sensor and the speed sensor and for implementing a first counter and a second counter.

14. A vehicle with a combustion engine, either pure or hybrid, said vehicle comprising an electric starter, a temperature sensor able to measure a value of a physical quantity relating to a temperature of the coolant, a speed sensor able to measure a value of a physical quantity relating to engine speed of the combustion engine, and a computer for managing the drive system of the vehicle as claimed in claim 11, suitable for collecting the values measured by the temperature sensor and the speed sensor and for implementing a first counter and a second counter.

* * * * *